(12) United States Patent
Nakano et al.

(10) Patent No.: US 6,534,384 B2
(45) Date of Patent: Mar. 18, 2003

(54) METHOD FOR MANUFACTURING SOI WAFER INCLUDING HEAT TREATMENT IN AN OXIDIZING ATMOSPHERE

(75) Inventors: Masatake Nakano, Gunma-ken (JP); Katsuo Yoshizawa, Nagano-ken (JP)

(73) Assignee: Shin-Etsu Handotai Co., Ltd., Chiyoda-Ku (JP)

( * ) Notice: Subject to any disclaimer, the term of this patent is extended or adjusted under 35 U.S.C. 154(b) by 0 days.

(21) Appl. No.: 09/324,939

(22) Filed: Jun. 3, 1999

(65) Prior Publication Data

US 2001/0055863 A1 Dec. 27, 2001

(30) Foreign Application Priority Data

Jun. 4, 1998 (JP) .......................................... 10-156088

(51) Int. Cl.$^7$ ............................................... H01L 21/46
(52) U.S. Cl. ...................... 438/459; 438/690; 438/704; 438/734; 438/409
(58) Field of Search ................. 438/459, 690, 438/704, 734, 409; 156/632, 625; 148/DIG. 12, DIG. 135

(56) References Cited

U.S. PATENT DOCUMENTS

| | | | |
|---|---|---|---|
| 5,232,870 A | | 8/1993 | Ito et al. |
| 5,340,435 A | * | 8/1994 | Ito et al. .................... 156/632 |
| 5,494,849 A | * | 2/1996 | Iyer et al. ...................... 437/63 |
| 5,665,631 A | * | 9/1997 | Lee et al. .................... 438/459 |
| 5,773,355 A | | 6/1998 | Inoue et al. |
| 5,863,829 A | * | 1/1999 | Nakayoshi et al. .......... 438/459 |
| 5,918,139 A | * | 6/1999 | Mitani et al. ................ 438/459 |
| 6,004,860 A | * | 12/1999 | Ogawa et al. ............... 438/406 |
| 6,090,688 A | * | 7/2000 | Ogawa et al. ............... 438/459 |
| 6,110,391 A | | 8/2000 | Takei et al. |

FOREIGN PATENT DOCUMENTS

| | | |
|---|---|---|
| EP | 0476897 | 3/1992 |
| JP | 5-46086 | 3/1985 |
| JP | 60-50970 | 3/1985 |
| JP | 64-89346 | 4/1989 |
| JP | 5160074 | 6/1993 |
| JP | 6176993 | 6/1994 |
| JP | 8330553 | 12/1996 |
| JP | 9-64321 | 3/1997 |
| JP | 9246506 | 9/1997 |

OTHER PUBLICATIONS

Funjino et al., "Silicon Wafer Direct Bonding through the Amorphous Layer", *Jpn. J. Applied Physics*, pp. 4322–4324(1995).
Maleville et al., "Wafer Bonding and H–implantation Mechanisms Involved in the Smart–cut® Technology", *Materials Science and Engineering*, pp. 14–19 (1997).
An English Language abstract of JP 9–064321.
An English Language abstract of JP 8–330553.
An English Language abstract of JP 1–089346.
An English Language abstract of JP 6–176993.
An English Language abstract of JP 9–246506.
Patent abstracts of Japan with JP 6–176993. Abstracts Only.
An English Abstarct of JP 60–50970. Abstracts Only.

* cited by examiner

*Primary Examiner*—Olik Chaudhuri
*Assistant Examiner*—Nathan W. Ha
(74) *Attorney, Agent, or Firm*—Greenblum & Bernstein, P.L.C.

(57) ABSTRACT

A method for manufacturing an SOI wafer. The method includes forming an oxide film on a surface of at least one silicon wafer of two silicon wafers. The method also includes bonding the silicon wafers through the oxide film at room temperature to form a room temperature bond end, one of the two silicon wafers being a bond wafer. The method further includes heat treating the wafers in an oxidizing atmosphere to form a heat treatment bond end. Thereafter, an outer periphery of the bond wafer is removed from an outer peripheral edge of the bond wafer up to a region between the room temperature bond end and the heat treatment bond end. The thickness of the bond wafer is reduced to form an SOI layer.

12 Claims, 3 Drawing Sheets

METHOD FOR MANUFACTURING SOI WAFER INCLUDING HEAT TREATMENT IN AN OXIDIZING ATMOSPHERE

BACKGROUND OF THE INVENTION

1. Field of the Invention

This invention relates to a method for manufacturing a bonded SOI (a silicon on insulator) wafer in which two silicon wafers are adhered to each other through a silicon oxide film, a bonded SOI wafer manufactured by this method, and more particularly to a method for removing an outer peripheral part of the SOI wafer.

2. Description of the Related Art

As a method for manufacturing a bonded SOI wafer, it has been well known in the related art to provide a technology for bonding two silicon wafers through a silicon oxide film, for example, a method for forming an oxide film on at least one wafer, closely contacting these wafers to each other without placing any foreign materials at the joint surface, thereafter heat treating them at a temperature of about 200 to 1200° C. to increase a bonding strength, as disclosed in the gazette of Japanese Patent Publication No. Hei 5-46086.

The bonded wafer of which bonding strength is increased through performing a heat treatment is enabled to be ground and polished after the treatment, so that the wafer applied to form an element is reduced in its thickness to a desired thickness under grinding and polishing operations and then it is possible to form the SOI layer forming an element.

However, since surfaces of both wafers just before being bonded to each other are mirror finished by a so-called mechano-chemical polishing, an area due to polishing unevenness is present at their outer peripheral portions. Accordingly, a unbonded (unjoined) portion of about 1 to 3 mm is generated at the outer peripheral portion of the bonded wafer made by bonding both wafers.

If one of the wafers is ground and polished while the unbonded portion is left, a certain peeling-off state occurs at the unbonded portion during the grinding and polishing stage, resulting in that the element forming region (device fabricating region) is applied with bad influences such as damage or adhesion of particles and the like and so it is necessary to remove the unbonded portion in advance.

In view of the foregoing, the gazette of Japanese Patent Laid-Open No. Hei 6-176993 has a proposal of method for making a bonded wafer in which two silicon wafers are closely contacted to each other through an oxide film, thereafter they are heat treated in oxidizing atmosphere, an area including a unbonded part at the outer periphery of the bonded wafer with an increased bonding strength is ground down to a location just before a bonding interface between it and a base wafer (a second silicon wafer acting as a supporting member) from a thickness direction of a bond wafer (a first silicon wafer becoming an element region), thereafter they are etched up to the bonding interface to remove the unbonded portion completely, and then the bond wafer is ground and polished to reduce its thickness up to its desired thickness.

In accordance with this method, although it becomes possible to remove the unbonded portion without changing a shape of the base wafer, it is generally applied to remove at least 3 mm from an outer peripheral edge of the bond wafer for a sake of safety as an outer peripheral removing width for removing the unbonded portion completely.

In turn, as a recent trend of high integration and high speed in operation of semiconductor devices is applied, it is required to have a thin thickness of the SOI layer and a uniform film thickness and more practically, it is required to have a film thickness and its uniformity of about 0.1±0.01 $\mu$m.

In order to realize the thin film SOI wafer having such a film thickness and its uniformity by a bonded substrate, the related art grinding and polishing could not attain a reduced thickness and so a so-called PACE (plasma assisted chemical etching) process disclosed in the gazette of Japanese Patent Laid-Open No. Hei 5-160074 has been developed as a new technology of attaining a thin film.

This PACE process is a method for uniforming a thickness of a thin film by a vapor phase etching, wherein a distribution of thickness of the SOI layer to be uniformed is measured in advance to make a map of thickness distribution, the thick portion is locally etched in vapor phase under a numerical control in accordance with the map and removed, thereby it is possible to make the thin film SOI layer having a thin film and quite uniform film thickness.

As a raw material wafer for making the thin film SOI wafer by this PACE process, it is a normal way to use the SOI wafer of which thickness is reduced by applying the method disclosed in the aforesaid gazette of Japanese Patent Laid-Open No. Hei 6-176993, for example, removing a unbonded portion of the outer peripheral part, and grinding and polishing the SOI wafer down to about several $\mu$m or so.

However, since the SOI wafer applied as a raw material wafer for the aforesaid PACE process is applied with the aforesaid mechano-chemical polishing process at the final stage of thickness reducing work, a certain polishing unevenness may be produced at its outer peripheral part and so a thickness of the SOI layer becomes thin as it approaches the outer-most circumference as shown in FIG. 3A. Then, in the case that a desired film thickness of the SOI layer is made to be less than 1.5 $\mu$m, an angle $\theta$ formed between the SOI layer and a buried oxide layer is quite gradual shape of 1° or less.

Further, as the PACE method is applied to this SOI wafer, the PACE method has a tendency that an etching speed at an outer circumference of the wafer is made faster as compared with that of its central part, so that its gradual shape is promoted and the buried oxide layer of the base is exposed at the outer-most circumference of the thin film SOI layer after performing the PACE method. Accordingly, the PACE method is originally carried out after removing about 3 mm from the outer circumferential edge of the bond wafer, so that an area having no SOI layer is further widened after performing the PACE method.

As described above, if the outer circumferential part of the SOI layer is provided with a region where the SOI layer is removed and the buried oxide layer of base part is exposed, polysilicon is deposited on the exposed oxide film at the device fabricating stage when an epitaxial layer is deposited on the SOI layer, resulting in that it may become a source of contamination such as particles or the like.

In addition, even in the case that an oxide film is not exposed just before depositing the epitaxial layer, it is exposed in hydrogen atmosphere at a high temperature when the temperature is increased for depositing the epitaxial layer, so that as shown in FIG. 3B, a reaction may occur at an interface part between the SOI layer and the oxide layer or an etching of the SOI layer with hydrogen is produced, the oxide layer is exposed at the outer circumferential part where the SOI layer is particularly thin and the similar result as that of the aforesaid one is attained after deposition of the epitaxial layer.

In turn, as described above, the SOI wafer manufactured by the related art method is set such that a diameter of the SOI layer is made smaller than that of the base wafer by about 6 mm in order to remove the unbonded portion of the outer circumference for a sake of safety. Although it is natural that the larger an effective area of the SOI wafer, the better for making the device on the SOI wafer, its diameter is originally a small value of about 6 mm and as the outer circumference part having a thin SOI layer as described above is made thinner or removed, the area where the device can be fabricated is made more narrow. In particular, this is a phenomenon occurred in the outer-most circumferential region, its influence may become large only through a reduction in effective area by about 1 mm or so.

SUMMARY OF THE INVENTION

In view of the aforesaid problems, the present inventors have searched about a position of the bonding outer circumferential end before and after performing a heat treatment of the bonded wafer and attained the following conclusion.

FIGS. 4A and 4B are sectional schematic views for showing a part near an outer circumferential part of the bonded wafer in which an oxide film is formed at the bond wafer and both the oxide film and a base wafer having no oxide film are bonded under a room temperature, thereafter they are heat treated in oxidizing atmosphere.

FIG. 4A is a sectional view just after bonding at a room temperature, wherein the outer-most circumferential part of the bonded portion between the bond wafer and the base wafer is indicated as a bonding end B at a room temperature. When the wafer is heat treated in an oxidizing atmosphere, an oxide film is grown at a region indicated in FIG. 4B in the base wafer. In turn, although the oxide film of the bond wafer is also thickened, its thickness is small as compared with that of the base wafer, so that its description is eliminated herein.

As the oxide film is grown at the base wafer, a clearance between the bond wafer and the base wafer is filled by the oxide film as shown in FIG. 4B, so that the outer-most circumferential part of the bonded portion between the bond wafer and the base wafer is moved to the heat treatment bonding end C.

In the related art, in order to avoid peeling of the unbonded portion of the bond wafer during its thickness reducing work, the SOI placed inside the bonding end B at a room temperature and from the outer circumferential end of the bond wafer to the outer circumferential end A of the SOI in FIG. 4B, i.e. to a position spaced apart by about 3 mm, for example, was completely removed through grinding and etching, thereafter a thickness reducing work for the bond wafer was carried out.

However, according to the study performed by the present inventors, it has been found that if the outer circumferential part of the bond wafer is removed in such a way that a position of the outer circumferential end A of the SOI may be located inside the heat treated bonding end C, no peeling of the bond wafer is produced at all at the thickness reducing work stage even though it is not placed inside the bonding end B at a room temperature as found in the related art and it has a bonding strength capable of enduring against manufacturing of the device.

However, a part between the bonding end B at a room temperature and a heat treated bonding end C is a region where they are bonded by filling the oxide film, so that it is preferable to set the position of the outer circumferential end A of SOI more inside the bonding end B at a room temperature in order to attain a more positive assurance that there occurs no problem such as peeling-off during manufacturing of the device.

The present invention is invented in reference to the aforesaid acknowledgement and one aspect of the invention consists in a method for manufacturing an SOI wafer characterized in that an SOI layer is formed by the steps of forming an oxide film on a surface of at least one silicon wafer of two silicon wafers, bonding the other silicon wafer through the oxide film at a room temperature, the wafers are heat treated in oxidizing atmosphere, thereafter an outer periphery of a bond wafer is removed from an outer peripheral edge of the bond wafer up to a region between bonding ends through bonding at a room temperature and heat treatment bonding ends and making the bond wafer into a thin layer of desired thickness As described above, an outer circumferential removing width of the bond wafer is set in a region between the bonding end at a room temperature and the bonding end at a heat treatment, the device work region in the SOI layer can be widened more than that of the related art, it becomes possible to attain the SOI wafer having an SOI layer with an outer circumferential removing width of a width ranging from the outer circumferential edge of the base wafer to the outer circumferential edge of the SOI layer being less than 1 mm.

In addition, after forming the SOI layer, it is also possible to perform a vapor phase etching and form a thin film SOI layer. In this case, since the outer circumference removing width of the bond wafer is a region between the bonding end at a room temperature and a heat treated bonding end and the oxide film thickness exposed by removing the outer circumference is thicker than that of the buried oxide layer, resulting in that even if the vapor phase etching is present as found in the PACE process in such a way that an extreme difference is not provided in an etching rate between silicon and oxide film, it is possible to prevent occurrence of surplus groove or step caused by the etching reached to the surface of the base wafer. In addition, the outer circumference removing width before performing a vapor phase etching is set between the bonding end at a room temperature and a heat treated bonding end, so that even after performing the vapor phase etching, it is possible to attain positively the thin film SOI wafer in which the film thickness of the SOI layer is 1.5 μm or less and the outer circumference removing width is 3 mm or less.

Further, it is possible to assure positively that problems such as peeling during the device fabrication are not produced by removing the outer circumference of either the aforesaid SOI layer or the thin film SOI layer up to the inside of the bonding end at a room temperature after forming either said SOI layer or said thin film SOI layer, the uneven thickness part at the outer circumference generated by polishing or vapor phase etching can be removed and the exposure of the buried oxide layer during epitaxial growth can be prevented positively. Since these outer circumferential unevenness is remarkable in the case that a thickness of the SOI layer is 1.5 μm or less, if it is applied to the SOI wafer having a thickness of 1.5 μm or less, its effect is remarkable.

In another aspect of the present invention, an oxide film is formed on a surface of at least one silicon wafer of two silicon wafers, the other silicon wafer is bonded through the oxide film at a room temperature, the wafers are heat treated in oxidizing atmosphere, thereafter an outer periphery of a bond wafer is removed from an outer peripheral edge of the bond wafer up to a first region inside bonding ends through their bonding at a room temperature, a thickness of the bond wafer is reduced to a desired thickness to form an SOI layer, thereafter an outer periphery of the SOI layer is removed down to inside the first region.

Even with this method, it is similarly possible to perform a positive prevention of exposure of the buried oxide layer during epitaxial growth. Then, this method may provide a more effect if it is applied to the SOI wafer with the film thickness of the SOI layer being 1.5 $\mu$m or less.

In further aspect of the present invention, there is provided an SOI wafer in which a film thickness of the SOI layer is 1.5 $\mu$m or less and the SOI wafer is characterized in that an angle formed by a surface near the outer circumferential edge of the SOI, the buried oxide layer and an interface of the SOI layer is approximately more than 2°, it is possible to prevent positively an exposure of the buried oxide layer during epitaxial growth.

DESCRIPTION OF THE PREFERRED EMBODIMENTS

Figure 1:
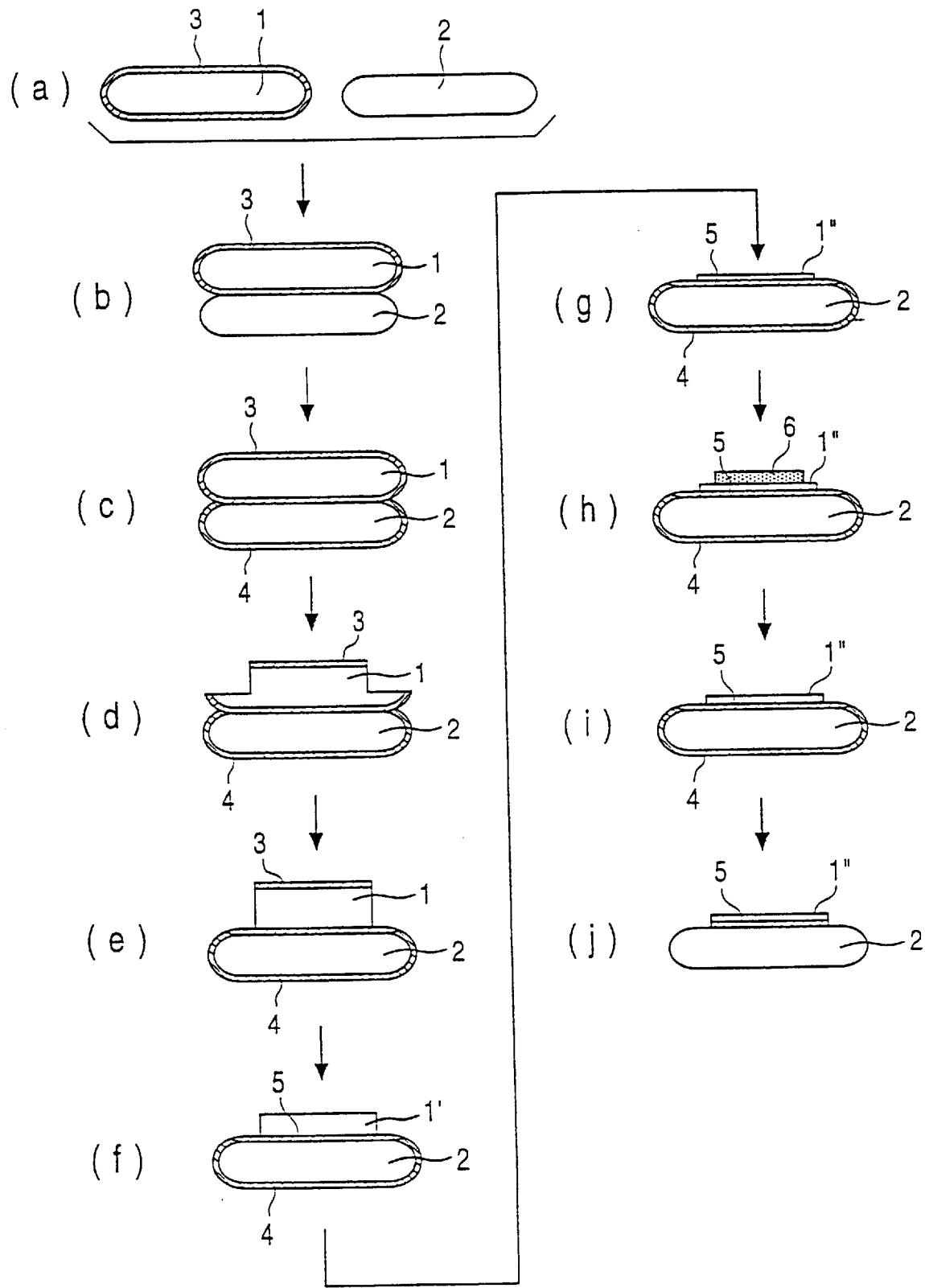
FIGS. 1a–1j is a flow chart for indicating one example of a manufacturing step for the SOI wafer in accordance with the present invention.

Referring now to the drawings, some preferred embodiments of the present invention will be described as follows. However, the present invention is not limited to these preferred embodiments.

The present invention will be described as follows mainly in reference to the case in which the bond wafer formed with the oxide film at the surface and the base wafer not formed with the oxide film are used as two silicon wafers.

Figure 4A:
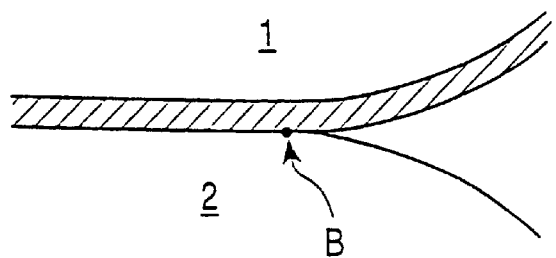
FIGS. 4A and 4B are schematic sectional views near the outer circumference of a bonded wafer.

In FIG. 1(a), both wafers are made such that at least their surfaces to be bonded are polished in mirror form and the oxide film 3 is formed at the bond wafer 1. Since the oxide film 3 becomes the buried oxide layer 5 of the SOI wafer, its thickness is set in response to its application and normally about 0.1 to 2.0 $\mu$m or less is applied. This is closely contacted (bonded) with the base wafer 2 at a room temperature under a clean atmosphere as shown in FIG. 1(b). Outer circumferential ends at the bonding position of both wafers at this time correspond to the position of the bonding end B at a room temperature shown in FIGS. 4A and 4B.

Then, the closely contacted wafers are heat treated in oxidizing atmosphere so as to increase a bonding strength. With such an arrangement as above, since an oxide film 4 is formed at the surface of the base wafer 2, a part of the clearance between it and the bond wafer 1 is filled, the outer circumferential end of the bonding position of both wafers 1, 2 becomes a position of the heat treatment bonding end C shown in FIG. 4 and is moved from the bonding end B at a room temperature at the time of bonding at a room temperature toward the outer circumference of the wafer.

Although a moving width from the position of the bonding end B at a room temperature to a position of the bonding end C of heat treatment is made different in response to a degree of unevenness at the outer circumferences of both wafers 1, 2 or thickness of each of the oxide films 3, 4, the moving width can be increased by thickening the oxide film 4 to be formed during a heat treatment. It is preferable that as the thickness of the oxide film 4, at least 1 $\mu$m, and preferably 1.5 $\mu$m or more. With such an arrangement as above, it is possible to make the moving width more than 1 mm. In addition, as oxidizing atmosphere during heat treatment, it is preferable to apply atmosphere containing moisture showing a high oxidation speed.

Although the oxide film is formed at the bond wafer 1 in the preferred embodiment, a moving width in the case that the oxide film is formed only at the base wafer 2 is also similar to that of the preferred embodiment. In turn, in the case that oxide films are formed at both wafers in advance, although a certain moving width can be attained, its moving width is small as compared with that of the former. In this case, in order to attain the moving width as large as possible, it is preferable to make a thin oxide film thickness to be formed in advance.

Figure 4B:
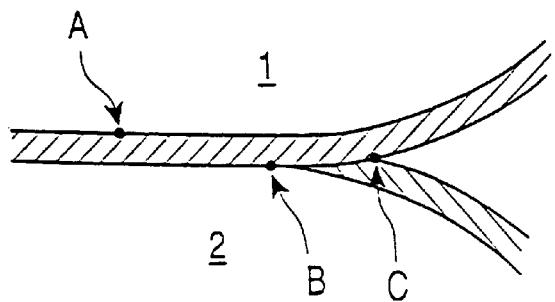

Then, as shown in FIG. 1(d), the outer circumferential part of the bond wafer 1 is ground in such a way that a part of the bond wafer 1 is left on the base wafer 2. A grinding width is set in a region between the bonding end C for heat treatment and the bonding end B at a room temperature from the outer circumferential edge of the bond wafer 1. As shown in FIG. 4B, this region corresponds to the part where both wafers 1, 2 are connected by the oxide film 4 formed by heat treatment and it has a sufficient strength capable of sufficiently enduring against the grinding at the aforesaid outer circumference or its subsequent etching process. In addition, it is preferable that the grinding at the outer circumference part is carried out from the outer circumference toward the center of the bond wafer 1 rather than toward the thickness direction of it due to the fact that a damage is hardly transmitted to the bonding surface or the base wafer 2.

Then, in FIG. 1(e), the remained part of the bond wafer 1 left at the outer circumference part is completely removed by etching operation. With such an arrangement as above, the base oxide film 4 is exposed at the outer circumferential part. As this etching, selective etching having a substantial high etching speed for silicon is applied as compared with the oxide film such as aqueous solution of KOH, NaOH or mixing liquid of fluoric acid and nitric acid, for example, although it is preferable to apply a so-called alkaline etching of higher selective characteristic.

FIG. 1(f) shows a thickness reducing work stage for the bond wafer 1, wherein the wafer is ground and polished by the same manner as that of the related art to be finished to a thickness of the desired SOI. layer 1'. As a thickness of the SOI layer to be finished, several $\mu$ms are preferable in the case that a thin film thickness is formed by the vapor phase etching (PACE process), although no specific value is limited to other cases than the foregoing.

Figure 2A:
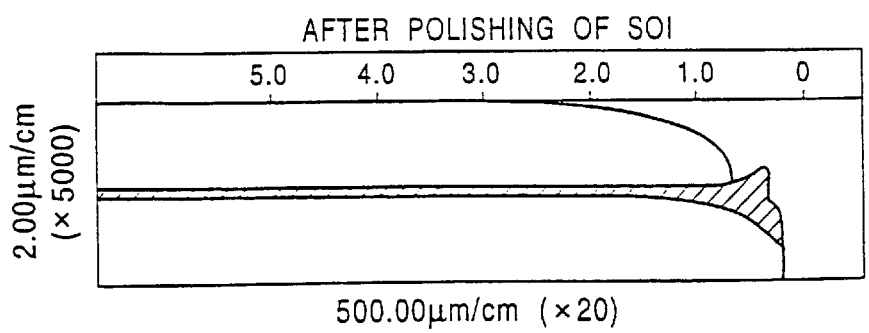
FIGS. 2A–2D are partial sectional views for showing a major part of the SOI wafer at the steps (f) to (j) in FIG. 1.

FIG. 1(g) shows a thin film forming stage with PACE process. Since this PACE process has not so high selectivity as compared with that of the aforesaid alkaline etching process, the oxide film 4 exposed to the outer circumferential part is substantially etched, as shown in FIG. 2A, although the oxide film thickness at this part is substantially thicker than that of the buried oxide layer 5, so that the etching performed by the PACE process is not reached to the base wafer 2. In this case, just after performing this PACE process, it may also be applicable that a polishing called as a touch polishing having a quite less amount of stock removal (a polishing stock removal of about 5 to 15 nm) or a heat treatment is applied to remove some defects left on the surface.

Figure 2B:
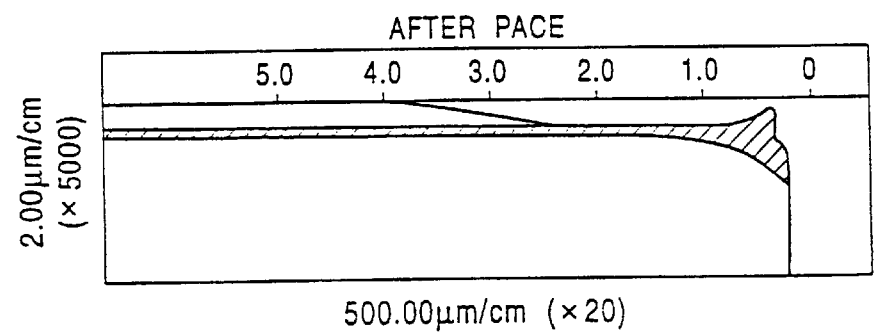
Figure 2C:
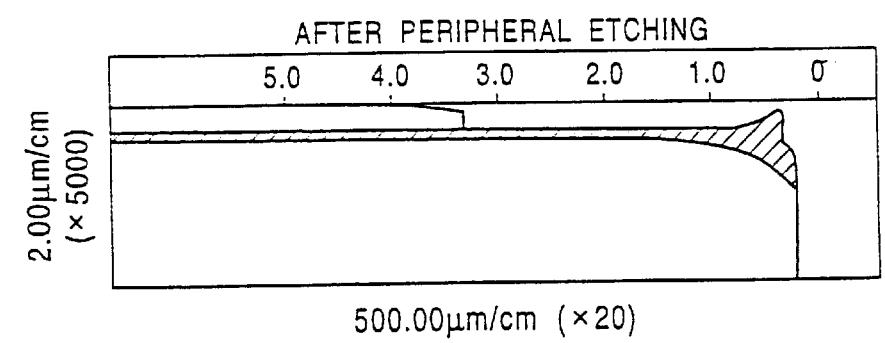

FIG. 1(h) shows a stage in which a masking tape 6 is adhered to the surface of the SOI layer 1" after PACE process. The outer circumference of the surface of the SOI layer after PACE process shows a sloped (wedge) shape as shown in FIG. 2B, wherein an angle formed by the surface near the outer circumferential end of the SOI layer, the buried oxide layer and the interface of the SOI layer is 1° or less. In view of this fact, in order to remove the wedge shaped portion of the outer circumference, the masking tape 6 of anti-etching characteristic is adhered to it. The outer circumferential end of the masking tape 6 is set to be inner side than the bonding end B at a room temperature of the SOI wafer. Under this state, if the selective etching which is similar to that of the aforesaid step (e) is carried out, as shown in FIGS. 1(i) and 2C, the outer circumferential end of the SOI layer is placed more inside than the bonding end B at a room temperature and an angle formed by the surface near the outer circumferential end of the SOI layer, the buried oxide layer 5 and the interface of the SOI layer 1" can be positively set to 2° or more.

If the outer circumferential end of the SOI layer 1" is located more inside the bonding end B at a room temperature, the SOI layer in the bonded region wherein the oxide film is filled by a heat treatment is completely removed, resulting in that no problem such as peeling of the SOI layer 1" occur during manufacturing of the device. In addition, if the angle between the oxide film and the interface of the SOI layer is approximately 2° or more, it is possible to prevent positively an exposure of the buried oxide layer 5 caused by exposure in hydrogen atmosphere kept in its increasing temperature when the epitaxial growth is carried out.

Figure 2D:
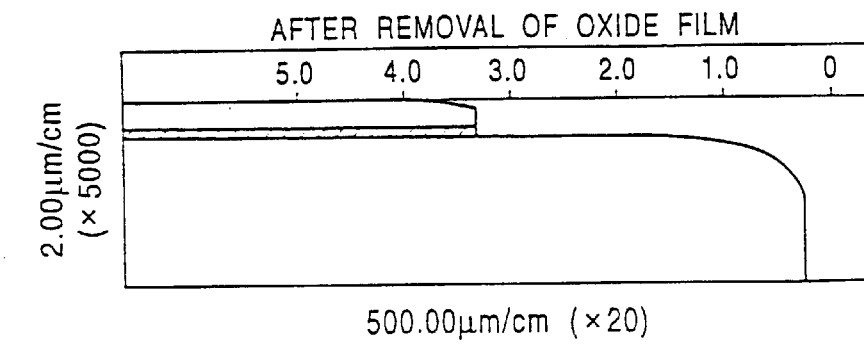
Figure 3A:
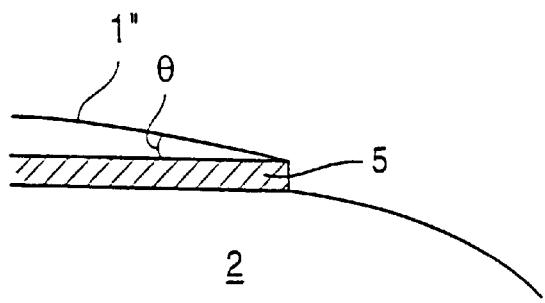
FIGS. 3A and 3B are sectional views for showing an outer circumference of the SOI wafer using PACE process.
Figure 3B:
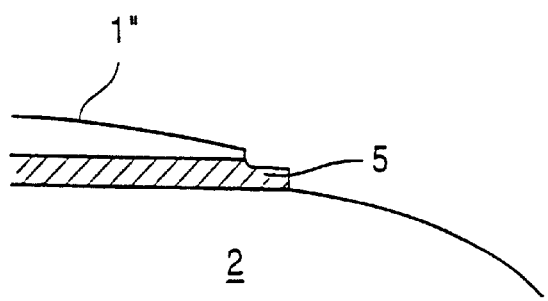

Further, since the oxide film just below the SOI layer at the outer circumference removed in FIG. 1(i) contains a portion more outside the bonding end B at a room temperature, it is preferable to remove it at this stage. However, as shown in FIG. 1(j) and FIG. 2D, in the case that it is necessary to remove the oxide film 4 at the rear surface of the base wafer 1 depending on application of the SOI wafer, it is removed simultaneously at this stage, resulting in that it is not necessary to arrange any special stage.

[Preferred Embodiments]

EXAMPLE 1

At first, two CZ wafers polished in mirror surface with a diameter of 150 mm, a thickness of 625 µm, a conductive p-type and a resistivity of 10 to 20 Ω·cm were prepared, one wafer was formed as a bond wafer and an oxide film of 0.5 µm was formed at the surface by thermal oxidation. Then, the bond wafer and the base wafer were closely contacted to each other at a room temperature and heat treated in atmosphere containing water vapour at 1100° C. for 2 hours. As a result, an oxide film of about 1.5 µm was formed at the base wafer.

Then, as shown in FIG. 1(d), a grinding with a grinding stock removal of about 555 µm was carried out for the area ranging from the outer circumferential edge of the bond wafer to a position by about 0.8 mm over the entire circumference of the wafer. Then, the remaining part of the outer circumferential segment by about 70 µm was removed by etching with 50% NaOH aqueous solution. After this operation, the normal grinding and polishing performed for the bond wafer were carried out to make the SOI layer having a thickness of 1.5±0.3 µm as shown in FIG. 2A. That is, at this stage, the SOI wafer having the SOI layer with an outer circumferential removing width of 0.8 mm was completed.

In the preferred embodiment, PACE process was applied to the wafer to make the thin film SOI wafer of 0.3±0.01 µm and with an outer circumferential removing width of the SOI layer being 2.5 mm as shown in FIG. 2B.

Then, the anti-acid masking tape was adhered to the surface of the thin SOI layer except a region ranging from the outer circumferential edge of the bond wafer to a location spaced apart by about 3.4 mm as shown in FIG. 2C, immersed in etching solution composed of mixed acid of fluoric acid and nitric acid and then the exposed surface of the thin film SOI layer was removed.

With such an arrangement as above, an angle formed by the surface of the formed thin film SOI layer near its outer circumferential end, the buried oxide layer and the interface of the SOI layer was about 2.5°. The measurement of this angle can be performed by observing a cross section of the SOI wafer with an SEM (a Scanning Electronic Microscope). However, in the preferred embodiment, this measurement was carried out by a non-destructive measuring method in which the outer circumferential end of the SOI layer was observed through an optical micro-scope over its surface and calculated in reference to a relation between the number of interference fringes indicating a variation in a film thickness of the SOI layer and a distance from the outer circumferential end of the SOI layer. (One interference fringe indicates a difference of thickness of about 0.06 µm.).

The bonding end formed at room temperature of the SOI wafer made by the preferred embodiment was formed at a position at about 1.5 mm from the outer circumferential edge of the bond wafer. Since the present invention involves removing an outer periphery of the bond wafer from an outer peripheral edge of the bond wafer up to a region between the room temperature bond end and the heat treatment bond end, as discussed above, it follows that the present invention may involve removing less than 1.5 mm of the bond wafer from the outer periphery. The bonding end formed after heat treatment (a heat treatment bonding end) was set at a position at about 0.4 mm from the circumferential edge. Since the bonding ends can be observed while the variation in thickness of the oxide film at a part where the buried oxide layer is exposed under the state shown in FIG. 2C becomes interference fringes, they can be measured easily.

EXAMPLE 2

Some steps ranging from (a) to (f) were carried out in the same manner as that of the example 1 except the fact that the outer circumferential removing width in FIG. 1(d) was about 1.5 mm so as to make the SOI wafer with a thickness of 1.5±0.3 µm. After this operation, the region spaced apart by about 3.0 mm from the outer circumferential edge was removed at the steps (h) to (i) without performing PACE process at (g). Then, an angle formed by the surface near the outer circumferential edge of the thin film SOI layer, the buried oxide layer and the interface of the SOI layer was measured in the same manner as that of the example 1 and it was about 2.8°.

Comparative Example

Some steps ranging from (a) to (g) were carried out in the same manner as that of the example 1 except the fact that the outer circumferential removing width in FIG. 1(d) was about 3.4 mm so as to make the thin film SOI wafer with a thickness of 0.3±0.01 µm. Then, an angle formed by the surface near the outer circumferential edge of the thin film SOI layer, the buried oxide layer and the interface of the SOI layer was measured in the same manner as that of the example 1 and it was about 0.8°.

Then, the SOI wafers made in reference to the examples 1 and 2 and the comparative example were immersed in aqueous solution of hydrofluoric acid (a concentration of 5 wt %) and the oxide film other than the buried oxide layer 5 was removed as shown in FIG. 1(j). Then, they were fed into the same epitaxial growth apparatus as those of these SOI wafers so as to form an epitaxial layer having a thickness of 3 μm at 1150° C. As a result, although a polysilicon layer was grown at the region of the outer circumferential end of the SOI layer of the SOI wafer in the comparative example spaced apart by about 1 mm, the polysilicon layer was not grown in the SOI wafer in the examples 1, 2.

The present invention is not limited to the aforesaid examples. The aforesaid examples are illustrative only and have substantially the same constitution as that of a technical concept described in the claims of the present invention and any of the embodiments showing a similar action and effect is included in the technical scope of the present invention.

For example, although the case in which a wet etching is carried out under application of the masking tape when the outer circumference is to be removed in FIG. 1(h) has been described as the examples of the present invention, the present invention is not limited to this case and it may be applicable that the masking is performed with either the photo-resist or the oxide film or the dry etching is used.

As described above, in accordance with the present invention, it is possible to widen the device fabricating region by the related art SOI wafer. In addition, the uneven part of the outer circumference generated by polishing or vapor phase etching is removed to enable deposition of polysilicon caused by exposure of the buried oxide layer during epitaxial growth to be prevented and concurrently no occurrence of problems such as peeling-off during device manufacturing operation can be assured positively.

In addition, in the case that the thin film SOI layer is formed under application of vapor phase etching showing no excessive difference in etching rate between silicon and oxide film such as PACE process, it is possible to prevent occurrence of surplus groove or step generated by the fact that the etching reaches up to the portion of the surface of the base wafer where the outer circumference is removed.

Having described specific examples of the invention with reference to the accompanying drawings, it will be appreciated that the present invention is not limited to those precise embodiments, and that various changes and modifications can be effected therein by one of ordinary skill in the art without departing from the scope of the invention as defined by the appended claims.

What is claimed is:

1. A method for manufacturing an SOI wafer, comprising:
   forming an oxide film on a surface of at least one silicon-wafer of two silicon wafers;
   bonding the silicon wafers through the oxide film at room temperature bonding the wafers to a room temperature bond end, one of the two silicon wafers being a bond wafer;
   heat treating the wafers in an oxidizing atmosphere to extend the bonding of the wafers to a heat treatment bond end toward an outer peripheral edge of the bond wafer past the room temperature bond end;
   thereafter, removing an outer periphery of the bond wafer from an outer peripheral edge of the bond wafer up to a region between the room temperature bond end and the heat treatment bond end; and
   reducing the thickness of the bond wafer to form an SOI layer.

2. The method of claim 1, further comprising vapor phase etching the SOI layer to form a thin film SOI layer.

3. The method of claim 1, further comprising removing an outer peripheral portion of the SOI layer such that the SOI layer is inside the room temperature bonding end.

4. The method of claim 2 further comprising removing an outer peripheral portion of the thin film SOI layer such that the thin film SOI layer is inside the room temperature bonding end.

5. The method of claim 3, wherein the SOI layer has a thickness of 1.5 μm or less.

6. The method of claim 4, wherein the thin film SOI layer has a thickness of 1.5 μm or less.

7. The method of claim 1, wherein the heat treating forms a second oxidized layer.

8. The method of claim 1, wherein removing an outer periphery of the bond wafer comprises removing less than 1.5 mm of the bond wafer from the outer periphery.

9. The method of claim 1, wherein removing an outer periphery of the bond wafer comprises removing less than 1 mm of the bond wafer from the outer periphery.

10. A method for manufacturing an SOI wafer, comprising:
    forming an oxide film on a surface of at least one silicon wafer of two silicon wafers;
    bonding the silicon wafers through the oxide film at room temperature a room temperature bond end, one of the silicon wafers being a bond wafer;
    heat treating the wafers in an oxidizing atmosphere;
    thereafter, removing an outer periphery of the bond wafer from an outer peripheral edge of the bond wafer to the room temperature bond end or to a first region inside the room temperature bond end;
    reducing a thickness of the bond wafer to form an SOI layer which includes an uneven portion at an outer periphery generated by polishing or vapor phase etching; and
    thereafter, removing an outer periphery of the SOI layer to inside the room temperature bond end or to inside the first region inside the room temperature bond end to prevent exposure of the buried oxide film during epitaxial growth.

11. The method of claim 10, wherein the SOI layer has a thickness of 1.5 μm or less.

12. The method of claim 10, wherein the heat treating forms a second oxidized layer.

* * * * *

UNITED STATES PATENT AND TRADEMARK OFFICE
CERTIFICATE OF CORRECTION

PATENT NO.    : 6,534,384 B2  Page 1 of 1
DATED         : March 18, 2003
INVENTOR(S)   : M. Nakano et al.

It is certified that error appears in the above-identified patent and that said Letters Patent is hereby corrected as shown below:

<u>Column 10,</u>
Line 16, after "2" insert -- , --.
Line 37, after "temperature" (first occurrence) insert -- to form --.
Line 39, after "atmosphere" insert -- to extend the bonding of the wafers to a heat treament bond end toward an outer peripheral edge of the bond wafer past the room temperature bond end --.

Signed and Sealed this

Twenty-third Day of December, 2003

JAMES E. ROGAN
*Director of the United States Patent and Trademark Office*